United States Patent [19]

Epple

[11] 3,905,836

[45] Sept. 16, 1975

[54] PHOTOELECTRIC SEMICONDUCTOR DEVICES

[75] Inventor: Richard Epple, Schwaigern, Germany

[73] Assignee: Telefunken Patentverwertungsgesellschaft m.b.H., Ulm, Germany

[22] Filed: Mar. 20, 1973

[21] Appl. No.: 343,175

Related U.S. Application Data

[63] Continuation-in-part of Ser. No. 811,707, April 1, 1969, abandoned.

[30] Foreign Application Priority Data

Apr. 3, 1968 Germany ............................ 1764107

[52] U.S. Cl. .................... 148/1.5; 29/574; 148/175; 324/150; 357/91

[51] Int. Cl. ............................................. H01l 7/54

[58] Field of Search .............. 148/1.5, 33, 175, 186, 148/191; 317/235 AQ; 29/574

[56] References Cited

UNITED STATES PATENTS

| | | | |
|---|---|---|---|
| 2,827,436 | 3/1958 | Bemski | 148/175 X |
| 3,108,914 | 10/1963 | Hoerni | 148/186 |
| 3,184,347 | 5/1965 | Hoerni | 148/33 |
| 3,320,103 | 5/1967 | Drake et al. | 148/191 |
| 3,390,311 | 6/1968 | Aven et al | 317/235 AQ |
| 3,440,113 | 4/1969 | Wolley | 148/187 |
| 3,711,325 | 1/1973 | Hentzschel | 148/188 X |

*Primary Examiner*—C. Lovell
*Assistant Examiner*—J. M. Davis
*Attorney, Agent, or Firm*—Spencer & Kaye

[57] ABSTRACT

In a method of making p-n junction photoelectric semiconductor device from a semiconductor body, the step of producing recombination centers in the interior of the body, whereby the maximum spectral sensitivity of the device may be chosen as a function of the number of recombination centers produced.

A photoelectric semiconductor body having a p-n junction on a first side and recombination centers in its interior.

9 Claims, 3 Drawing Figures

Inventor:
Richard Epple
By: Spencer & Kaye
Attorneys

Inventor:
Richard Epple
By: Spencer & Kaye
Attorneys

PHOTOELECTRIC SEMICONDUCTOR DEVICES

CROSS-REFERENCE TO RELATED APPLICATION

This application is a continuation-in-part of copending application Ser. No. 811,707 filed Apr. 1st, 1969 now abandoned.

BACKGROUND OF THE INVENTION

The present invention relates to a method of producing photoelectric semiconductor devices such as photoelectric cells or photoresistive cells and to photoelectric semiconductor devices as produced by the method.

Photoelectric semiconductor devices typically contain a semiconductor body having a p-n junction just below its surface. For example, the p-n junction may lie about 0.2 to 0.6 microns below the surface. This small spacing of the p-n junction below the surface is required in order that the device exhibit optimized photoelectric properties. The p-n junction of a photoelectric semiconductor device would not be placed in the interior, i.e., more than 10 microns below the surface, of the semiconductor body used for making the device.

U.S. Pat. No. 2,750,541 issued June 12th, 1956, to Russell S. Ohl for a "Semiconductor Translating Device" shows one method of creating the p-n junction of a photoelectric semiconductor device. Ohl's method involves the bombardment of a body of high purity silicon with ions for creating the effect of a p-n junction in close proximity to the bombarded surface.

SUMMARY OF THE INVENTION

It is an object of the present invention to provide a method of making photoelectric semiconductor devices allowing selection of maximum spectral sensitivity.

Another object of the invention is to provide a photoelectric semiconductor body having a novel internal structural situation useful for achieving desired maximum spectral sensitivities.

These as well as other objects which will become apparent in the discussion that follows are achieved, in a method of making a p-n junction photoelectric semiconductor device from a semiconductor body, by the step of producing recombination centers in the interior of the body, whereby the maximum spectral sensitivity of the device may be chosen as a function of the number of recombination centers produced, and be a photoelectric semiconductor body having a p-n junction on a first side and recombination centers in its interior.

GENERAL ASPECTS OF THE INVENTION

According to one aspect of the invention, there is provided a method of producing a photoelectric semiconductor device, which method includes the step of adjusting the spectral sensitivity of the photoelectric semiconductor device by the deliberate production of recombination centers in the interior of the semiconductor body of the device.

As a result of the production of recombination centers in the interior of the semiconductor body, the maximum spectral sensitivity of the photoelectric semiconductor body of the invention is shifted towards shorter wavelengths. The advantage here is that the maximum spectral sensitivity can be adapted to the particular purpose intended. Thus it is possible, for example, to shift the maximum spectral sensitivity up to the maximum of the solar specturm. Such a matching of the maximum spectral sensitivity is desirable, for example in photography, in particular for example in exposure meters. A shift in the maximum spectral sensitivity of solar cells is desirable, for example, when solar cells are used as control members for oil firing installations, because in this case they should not respond to a furnace wall glowing red. According to the invention, this can likewise be achieved by producing recombination centers in the semiconductor body of a solar cell, the maximum spectral sensitivity being shifted towards shorter wavelengths as a result of the incorporation of recombination centers.

BRIEF DESCRIPTION OF THE DRAWINGS

The invention will now be described in greater detail by way of example with reference to the accompanying drawings in which.

DESCRIPTION OF THE PREFERRED EMBODIMENTS

Figure 1:
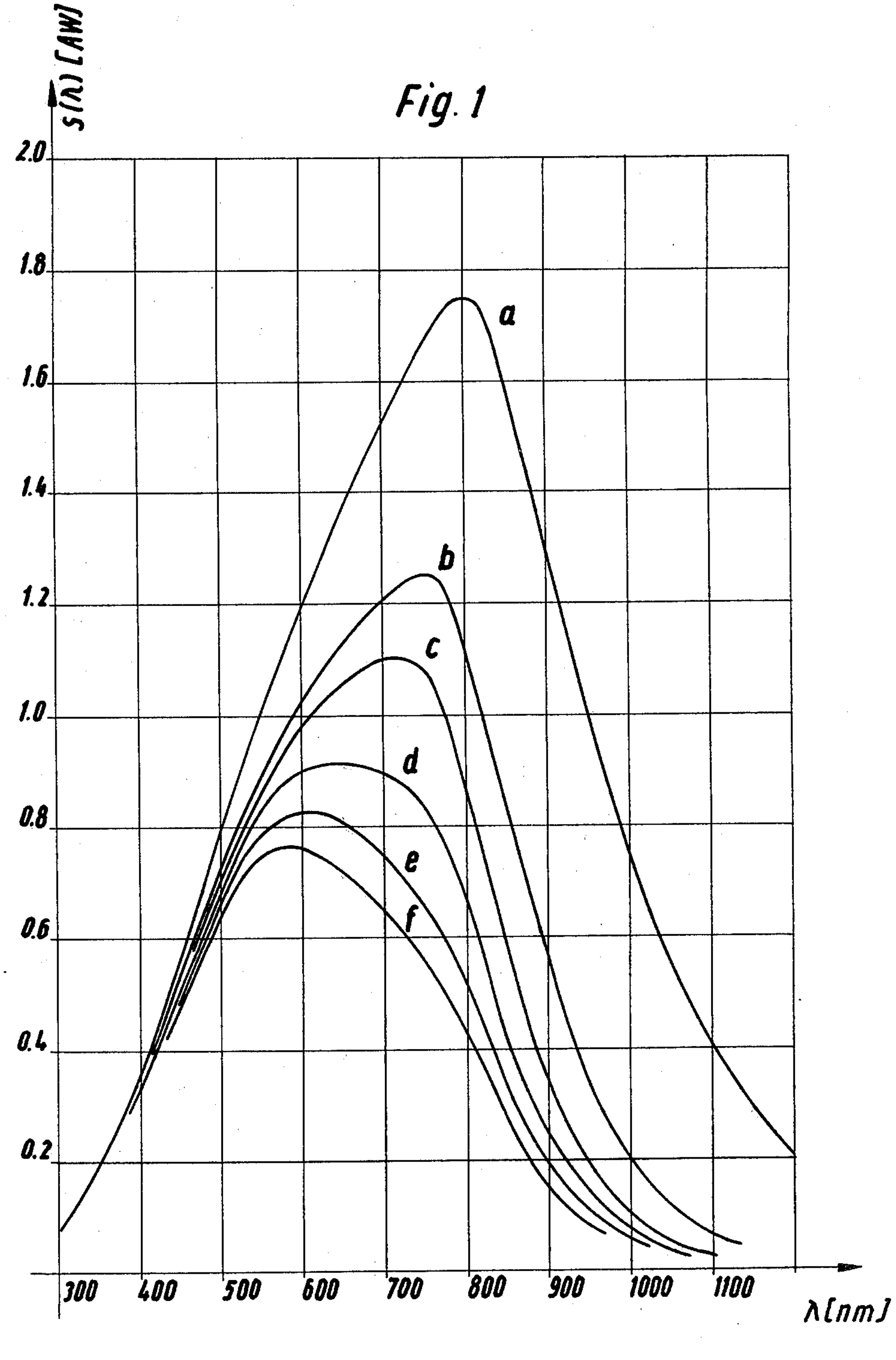
FIG. 1 is a graph of an embodiment of the invention in which the semiconductor body of a silicon solar cell has been irradiated with neutrons to different extents in order to produce different numbers of recombination centers.

Referring firstly to FIG. 1, curve *a* shows that a silicon solar cell without neutron bombardment has a maximum spectral sensitivity at a wavelength of about 800 microns. In the graph of FIG. 1, wavelength is measured on the abscissa while the ordinate shows the spectral sensitivity of the solar cell for any given wavelength.

Curve *b* shows the spectral sensitivity curve of the solar cell after a neutron irradiation of $10^{13}$ neutrons per $cm^2$, the maximum of the spectral sensitivity being shifted from 800 microns to 750 microns. The curve *c* corresponds to a neutron irradiation of $1 \times 10^{14}$ and the curve *e* a neutron irradiation of $3 \times 10^{14}$ per $cm^2$.

As a result of the neutron irradiation of $1 \times 10^{15}$ per $cm^2$, it is possible to shift the maximum spectral sensitivity of the solar cell from 800 microns originally (without neutron irradiation) as far as the maximum of the solar spectrum with a wavelength $\lambda$ of 550 microns. The long-wave component is severely suppressed.

Figure 2:
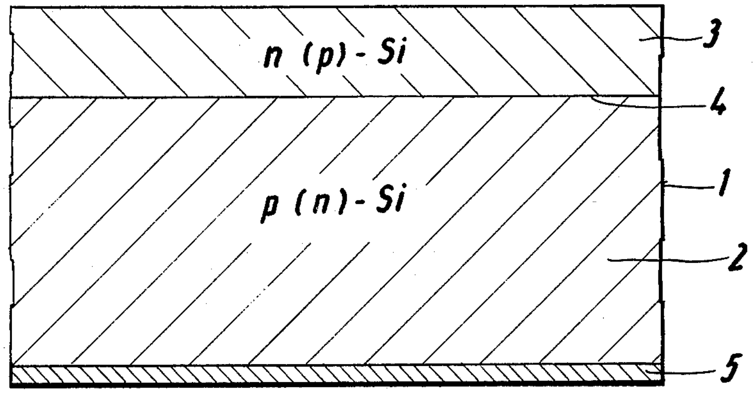
FIG. 2 is an elevational cross section of a semiconductor body in another example of the invention using the production of recombination centers in making a photoelectric semiconductor device.

FIG. 2 shows an example in which the recombination centers in the semiconductor body are produced not by irradiation but by indiffusion of recombination-center formers, for example, gold or copper. The subject of the example in FIG. 2 is a solar cell which consists of a semiconductor body 1 of silicon in which there are the p-type region 2 and the n-type region 3. These two regions form the p-n junction 4. The types of the regions 2 and 3 may be reversed. Metal coating 5 serves for contacting region 2 to enable the joining of it into an electrical circuit.

Figure 3:
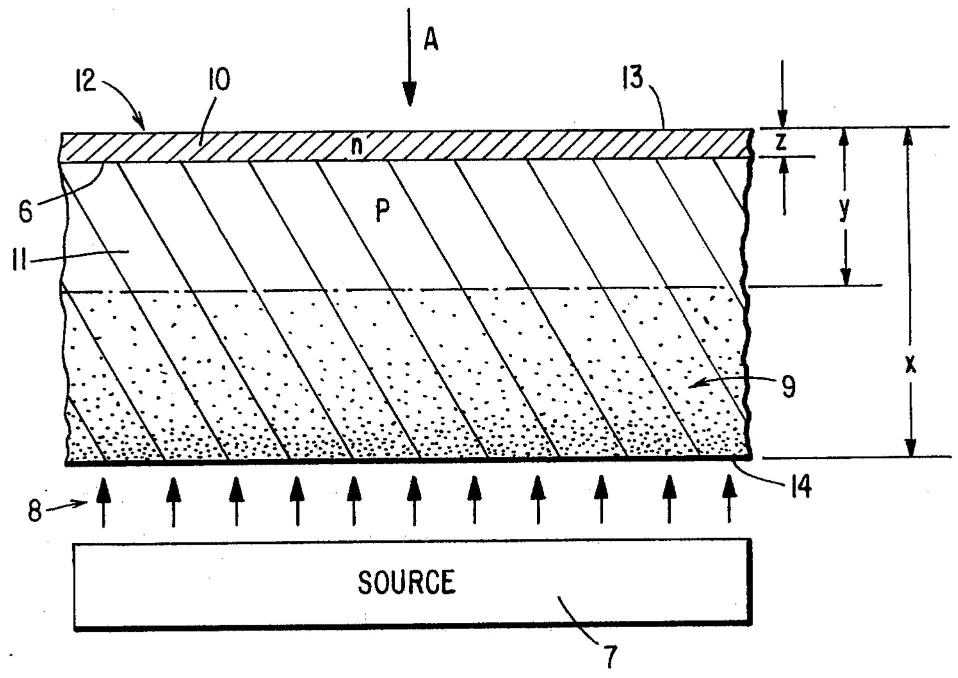
FIG. 3 is an elevational cross section of a semiconductor body in yet another embodiment of the invention.

Referring now to FIG. 3, there is shown a semiconductor body 12 of a photoelectric semiconductor device. Body 12 has an n-type region 10 and a p-type region 11. Regions 10 and 11 form at their interface a p-n junction 6. The conductivity types of regions 10 and 11 may be reversed, i.e., region 10 may be p-type and region 11 may be n-type.

The p-n junction 6 lies very near the surface 13 of the semiconductor body. Surface 13 is referred to as the first side. In a preferred example, the p-n junction 6 lies about 0.2 to 0.6 microns below the first side. The p-n junction is produced in conventional manner and preferably before the forming of the recombination centers 9 according to the present invention. The recombination centers 9 are indicated in FIG. 3 by stippling. In use, light falls on the first side of semiconductor body 12, as indicated by arrow A.

In the embodiment of FIG. 3, recombination centers are introduced into the interior of semiconductor body 12 in accordance with the present invention from a source 7 of neutron radiation 8 impinging on side 14 opposite to the first side. Side 14 is referred to as the second side. While it is preferred that source 7 act only on the second side, an appropriate source may be provided for acting on all sides of the body. Recombination centers in the interior of the semiconductor body may be created by a source 7 providing, rather than neutron radiation, electron radiation, proton radiation, the indiffusion of gold, or the indiffusion of copper. U.S. Pat. No. 3,184,347 issued May 18, 1965, to Jean A. Hoerni for "Selective Control of Electron and Hole Lifetimes in Transistors" provides technique adequate for the indiffusion of gold atoms for forming recombination centers.

The advantage of bringing the recombination centers in from the second side is that the concentration of recombination centers may be made greatest right on the second side, with the concentration decreasing as one considers locations deeper and deeper into the semiconductor body.

It is advantageous to have a zone extending from the first side about 50 microns into the body, which zone is substantially free of recombination centers. Recombination centers are present between this zone and the second side. In this way, the photoelectric current produced in the portion of the semiconductor body near the first side by a blue light fraction is not weakened by recombination of the created electron-hole pairs. In contrast, the electron-hole pairs created in the interior and near to the second side of the semiconductor body by the red light fraction undergo the strongest possible recombination and are thus lost to the photoelectric current. This effect is enhanced by having the recombination center concentration increase as the second side is approached.

For the production of recombination centers in the interior of a semiconductor body using radiation, radiation energies of about 1 MeV and radiation doses of $10^{10}$ to $10^{14}$ particles per $cm^2$ are required.

In the preferred embodiment of FIG. 3, dimensions *x*, *y*, and *z* are 200 to 300 microns, about 50 microns, and 0.2 to 0.6 microns, respectively, dimension *y* being the recombination center free portion of the semiconductor body. The expanse of body 12 in a plane perpendicular to FIG. 3 and intersecting FIG. 3 as a horizontal line is subject to no special limitations. As a rule, however, this expanse amounts to from a few square millimeters to a few square centimeters.

It will be understood that the above description of the present invention is susceptible to various modifications, changes and adaptations, and the same are intended to be comprehended within the meaning and range of equivalents of the appended claims.

I claim:

1. In a method of making a p-n junction photoelectric semiconductor device from a semiconductor body, the improvement comprising the step of intentionally producing a predetermined number of recombination centers in the interior of the body to set the maximum spectral sensitivity of the device as a function of the number of recombination centers produced.

2. In the method of claim 1, the additional feature that the step of producing includes irradiating the semiconductor body with neutrons.

3. In the method of claim 1, the additional feature that the semiconductor body is silicon.

4. In the method of claim 1, the additional feature that the step of producing is carried out on a semiconductor body already having a p-n junction.

5. In the method of claim 4, the additional features that the p-n junction is located adjacent a first side of the semiconductor body and the step of producing is carried out from a second side of the semiconductor body opposite to said first side.

6. In the method of claim 4, the additional features that the p-n junction is located 0.2 to 0.6 microns below said first side, that said semiconductor body is 200 to 300 microns thick, and that said step of producing includes exposing said semiconductor body to a recombination center forming medium, and controlling the concentration of and the time of exposure to said medium so that said semiconductor body is substantially free of recombination centers to about 50 microns below said first side and the concentration of recombination centers always decreases in going from said second side of said body opposite to said first side toward said first side.

7. A method of producing a desired shifted maximum spectral sensitivity in a p-n junction photoelectric semiconductor device, comprising the steps of determining the maximum spectral sensitivity as a function of the number of recombination centers in the interior of such a p-n junction device and thereafter producing in such a device which is to have the desired shifted maximum the appropriate number of recombination centers determined in said step of determining.

8. A method of producing a desired shifted maximum spectral sensitivity in a p-n junction photoelectric semiconductor device, comprising the steps of determining the maximum spectral sensitivity as a function of the amount of neutron radiation received by such a p-n junction device in its interior and thereafter exposing such a device which is to have the desired shifted maximum to the appropriate amount of radiation determined in said step of determining.

9. In a method of making a pn junction photoelectric semiconductor device in a semiconductor body including forming a pn junction adjacent a first surface of the body, the improvement comprising the step of setting the maximum spectral sensitivity of the device to a desired value by producing a predetermined number of recombination centers in the interior of the semiconductor body.

* * * * *